US007604091B2

(12) United States Patent
Kane et al.

(10) Patent No.: US 7,604,091 B2
(45) Date of Patent: Oct. 20, 2009

(54) ASYMMETRIC AND CONTINUOUSLY CURVED SPEAKER DRIVER ENCLOSURE TO OPTIMIZE AUDIO FIDELITY

(75) Inventors: Daniel Steven Kane, Milford, PA (US); Kirk Samuel Lombardo, Milford, PA (US)

(73) Assignee: Plantronics, Inc., Santa Cruz, CA (US)

(*) Notice: Subject to any disclaimer, the term of this patent is extended or adjusted under 35 U.S.C. 154(b) by 0 days.

(21) Appl. No.: 11/762,649

(22) Filed: Jun. 13, 2007

(65) Prior Publication Data

US 2008/0308344 A1 Dec. 18, 2008

(51) Int. Cl.
*A47B 81/06* (2006.01)
*H05K 5/02* (2006.01)
*H05K 5/00* (2006.01)

(52) U.S. Cl. ....................... 181/199; 181/153; 381/345; 381/336

(58) Field of Classification Search ................. 181/199, 181/148, 153, 156; 381/345, 352, 349, 336
See application file for complete search history.

(56) References Cited

U.S. PATENT DOCUMENTS 2,881,850 A * 4/1959 Bonn ......................... 181/153
3,026,955 A * 3/1962 Wilber ....................... 181/153
4,083,426 A * 4/1978 Peugh ........................ 181/156
4,142,604 A * 3/1979 Smith ......................... 181/156
4,750,585 A * 6/1988 Collings ..................... 181/148
4,865,153 A * 9/1989 Toyoda ....................... 181/153
4,964,482 A * 10/1990 Meyer ........................ 181/146
5,661,271 A * 8/1997 Moser ........................ 181/199
5,900,594 A * 5/1999 Monson ...................... 181/199

(Continued)

FOREIGN PATENT DOCUMENTS

DE 4004780 A1 * 8/1991

(Continued)

*Primary Examiner*—Edgardo San Martin
(74) *Attorney, Agent, or Firm*—Greenberg Traurig, LLP

(57) ABSTRACT

An improved system and method for reducing standing waves and diffracted waves in speaker a driver enclosure is disclosed. The speaker driver enclosure has an interior enclosure surface, shaped such that any cross section taken of it comprises a looped, substantially continuously curved, non-rational B spline. A rear enclosure surface is provided, the rear enclosure surface being shaped substantially the same as the interior enclosure surface and offset from the interior enclosure by a wall thickness. An outer baffle surface has slightly varying curvatures such that substantially any cross section taken of it comprises a continuously curved, non-rational B spline and a flat surface shaped such that at least one loudspeaker driver may be mounted to it. A loudspeaker driver is mounted to the flat surface. The enclosure may include a rounded edge surface, whereby substantially every cross section taken along it has a slightly different continuously curved, non-rational B spline, such that a line tangent to it does not intersect the flat surface.

10 Claims, 5 Drawing Sheets

U.S. PATENT DOCUMENTS 6,035,963 A * 3/2000 Wollitz ........................ 181/200
6,356,643 B2 * 3/2002 Yamagishi et al. .......... 381/349
6,385,324 B1 * 5/2002 Koppen ...................... 381/336
6,598,700 B1 * 7/2003 Schroeder ................... 181/199
6,619,424 B2 * 9/2003 Manrique et al. ........... 181/199
6,675,932 B2 * 1/2004 Manrique et al. ........... 181/199
6,705,426 B2 * 3/2004 Copetti ....................... 181/155
6,763,117 B2 * 7/2004 Goldslager et al. .......... 381/345
2002/0114485 A1 * 8/2002 Ohira et al. ................. 381/386
2005/0053253 A1 * 3/2005 Sterns ........................ 381/345
2005/0084126 A1 * 4/2005 Milton ....................... 381/336

FOREIGN PATENT DOCUMENTS

DE 4203811 A1 * 8/1993
JP 54159215 A * 12/1979
JP 06351088 A * 12/1994

* cited by examiner

ASYMMETRIC AND CONTINUOUSLY CURVED SPEAKER DRIVER ENCLOSURE TO OPTIMIZE AUDIO FIDELITY

This application includes material which is subject to copyright protection. The copyright owner has no objection to the facsimile reproduction by anyone of the patent disclosure, as it appears in the Patent and Trademark Office files or records, but otherwise reserves all copyright rights whatsoever.

FIELD OF THE INVENTION

The present invention relates in general to the field of sound reproduction systems, and in particular to systems and methods for accurate sound reproduction.

BACKGROUND OF THE INVENTION

Loudspeaker enclosures which have sharp exterior edges at or within the periphery of the baffle produce undesirable audible edge diffraction which manifests itself as audible secondary point sources.

Edge diffraction occurs at all points along any sharp edge at or within the periphery of the baffle's exterior surface. When the length between 2 edge points is equal to the $2\pi$ to $4\pi$ conversion length, the edge diffraction will be audible as a second point source 90 degrees out of phase with the driver source. This phenomenon is described as incoherent phase response although it is commonly referred to as "muddy sound." It is caused by there being two different arrival times for the same frequency to the listener, both of which are audible. Incoherent phase response is multiplied if the driver is centered between any two points along the baffle's exterior surface edge.

Loudspeaker enclosures which have an interior pair or pairs of parallel surfaces with equal dimensions multiply sound waves, creating standing waves. Standing waves undesirably increase or decrease the amplitude of select frequencies, based upon the dimensions of the pair or pairs of parallel surfaces.

Standing waves are multiplied by rectangular or cubic loudspeaker enclosures due to the presence of two or four sidewalls having an equal area inherent to their design. The frequency coinciding with the pair or pairs of equally sized walls is multiplied, creating peaks or decreased, creating nulls. These anomalies cause very audible tone coloration and irregular frequency response.

Traditional loudspeaker enclosure design features used to reduce standing waves include batting material to reduce the amplitude of the standing waves and bracing on the interior surfaces. These solutions are less than optimal and typically increase the material and tooling costs associated with the manufacture of the loudspeaker enclosure.

OBJECTS AND SUMMARY OF THE INVENTION

It is therefore an object of the invention to provide an improved system and method for reducing standing waves and diffracted waves in speaker driver enclosures.

It is a further object of the invention to overcome one or more limitations of the prior art.

In an embodiment, the invention provides an improved system and method for reducing standing waves and diffracted waves in speaker a driver enclosure is disclosed. The speaker driver enclosure has an interior enclosure surface, shaped such that any cross section taken of it comprises a looped, substantially continuously curved, non-rational B spline. A rear enclosure surface is provided, the rear enclosure surface being shaped substantially the same as the interior enclosure surface and offset from the interior enclosure by a wall thickness. An outer baffle surface has slightly varying curvatures such that substantially any cross section taken of it comprises a continuously curved, non-rational B spline and a flat surface shaped such that at least one loudspeaker driver may be mounted to it. A loudspeaker driver is mounted to the flat surface. The enclosure may include a rounded edge surface, whereby substantially every cross section taken along it has a slightly different continuously curved, non-rational B spline, such that a line tangent to it does not intersect the flat surface.

In an embodiment, the invention provides a method for designing and manufacturing a loudspeaker enclosure that substantially minimizes standing waves and diffracted wave multiplications. The method includes creates a closed volume with a continuously curved outer surface, with a substantially constantly changing radius, whereby substantially any cross section taken of the closed volume comprises a looped, continuously curved, non-rational B spline. A first surface having a shape substantially similar to the closed volume is created. A second surface is created, the second surface having slightly varying curvatures such that substantially any cross section taken of it comprises a continuously curved, non-rational B spline and a flat surface shaped such that at least one loudspeaker may be mounted to it. The second surface is sized such that it fully intersects the first surface and its surface area within the first surface contains the flat surface shaped, whereby at least one loudspeaker may be mounted to it. The second surface is merged with a larger portion of the first surface whereby a sharp edge is created where the first surface and the second surface intersect. An outer baffle surface is formed from the remaining portion of the second surface. A rear enclosure surface is formed, the rear enclosure surface comprising the remaining portion of the first surface. An outer rounded edge surface is formed, whereby substantially every cross section taken along it has a slightly different continuously curved, non-rational B spline, whereby a line tangent to it does not intersect the flat surface. An inner surface is formed, whereby the interior surface is a continuous surface offset from the outer baffle surface, outer rear enclosure surface, and outer rounded edge surface by a wall thickness. A loudspeaker enclosure is manufactured in accordance with the design.

In an embodiment, a loudspeaker enclosure is provided that substantially minimizes standing waves. The enclosure includes an interior enclosure surface, shaped such that any cross section taken of it comprises a looped, substantially continuously curved, non-rational B spline. A rear enclosure surface is provided, the rear enclosure surface being shaped substantially the same as the interior enclosure surface and offset from the interior enclosure by a wall thickness. A flat outer baffle surface is shaped such that at least one loudspeaker driver may be mounted to it.

In an embodiment, a loudspeaker enclosure is provided that substantially minimizes standing waves and diffracted wave multiplications. The enclosure has an interior enclosure surface and a rear enclosure surface. The rear enclosure surface is shaped substantially the same as the interior enclosure surface and it offset from the interior enclosure by a wall thickness. An outer baffle surface is provided, the outer baffle surface having slightly varying curvatures such that substantially any cross section taken of it comprises a continuously curved, non-rational B spline and a flat surface shaped such that at least one loudspeaker driver may be mounted to it. A loudspeaker driver is mounted to the flat surface. A rounded edge surface is provided and is shaped such that substantially every cross section taken along it has a slightly different continuously curved, non-rational B spline, whereby a line tangent to it does not intersect the flat surface.

The disclosed system and method can be used in any audio system to reduce standing waves and diffracted waves.

BRIEF DESCRIPTION OF THE DRAWINGS

The foregoing and other objects, features, and advantages of the invention will be apparent from the following more particular description of preferred embodiments as illustrated in the accompanying drawings, in which reference characters refer to the same parts throughout the various views. The drawings are not necessarily to scale, emphasis instead being placed upon illustrating principles of the invention.

DETAILED DESCRIPTION OF THE PREFERRED EMBODIMENT

Figure 1:
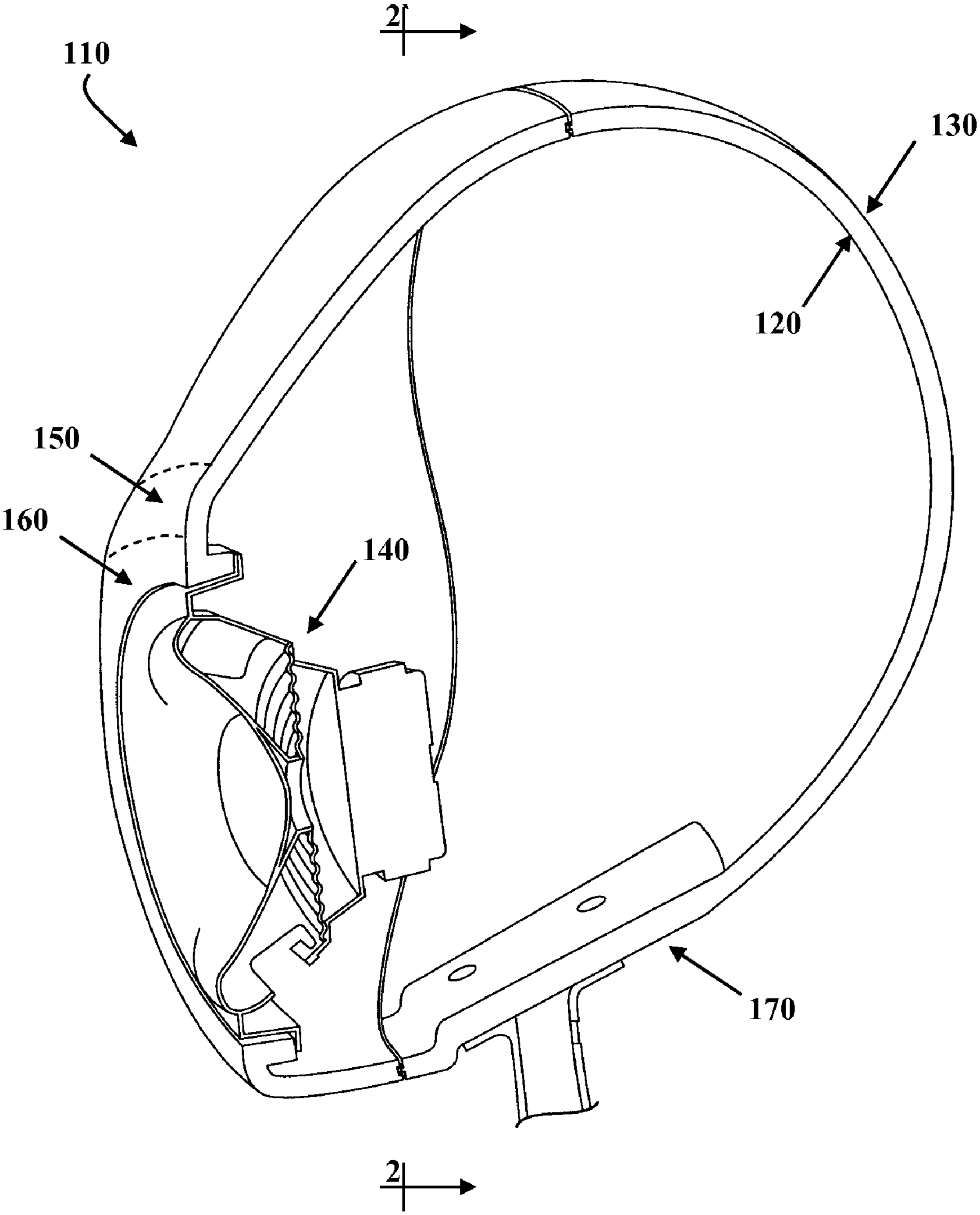
FIG. 1 shows a diagram illustrating the invention in accordance with one embodiment.

Reference will now be made in detail to the preferred embodiments of the present invention, examples of which are illustrated in the accompanying drawings.

In various embodiments, the system and method provides a loudspeaker enclosure that substantially minimizes standing waves and diffracted waves. The first step in designing the loudspeaker enclosure is creating a first surface. A closed volume with a continuously curved outer surface, with a constantly changing radius is created such that substantially any cross section taken of it presents an asymmetric profile that curves in only one direction. Any cross section take of the closed volume comprises a looped, continuously curved, non-rational B spline. Further, any cross section taken of the closed volume, when divided by any line will have asymmetric opposing sides. The first surface is formed such that it has a shape which is substantially the same as the closed volume.

The second step in designing the loudspeaker enclosure is creating a relatively flat second surface of slightly varying curvatures such that any cross section taken of it comprises continuously curved, non-rational B splines, except for a flat surface shaped such that at least one conventional speaker driver may be mounted to it. The second surface must be sized such that it fully intersects the first surface and its surface area within the first surface contains the flat surface shaped such that at least one conventional speaker driver may be mounted to it.

The third step in designing the loudspeaker enclosure is merging the second surface with a larger portion of the first surface whereby a sharp edge will be created where the first surface and the second surface intersect. An outer baffle surface is formed comprising the remaining portion of the second surface, and an outer rear enclosure surface is formed comprising the remaining portion of the first surface, whereby the outer baffle surface and the outer rear enclosure surface meet at the sharp edge.

The fourth step in designing the loudspeaker is creating an outer rounded edge surface by rounding the sharp edge, whereby every cross section taken along it has a slightly different continuously curved, non-rational B spline, such that its line of tangency with the outer baffle surface is not intersected by the flat surface.

The fifth step in designing the loudspeaker enclosure is creating an interior surface, whereby the interior surface is continuous surface offset from the outer baffle surface, outer rear enclosure surface, and the outer rounded edge surface by a wall thickness. The wall thickness is sized such that the and prevent the loudspeaker enclosure from vibrating during operation.

The sixth step in designing the loudspeaker enclosure is scaling the size of the loudspeaker enclosure such that the volume enclosed by the inner surface is equal to or greater than acoustic volume required by the at least one speaker driver.

In various embodiments, additional internal and external features may be added to the loudspeaker enclosure design. One or more ports may be added to improve low frequency response. Additionally, a mounting feature may be added to the loudspeaker enclosure design whereby the loudspeaker enclosure can be mounted, e.g., to a speaker stand, hung from a ceiling mount, or attached to feet. The mounting feature may be provided on the interior enclosure surface, the rear enclosure surface, or both. Preferentially, the mounting feature is not provided on the interior enclosure surface to minimize the occurrence of flat surfaces. The loudspeaker enclosure must be scaled to compensate for any acoustic volume consumed by the additional features.

Figure 2:
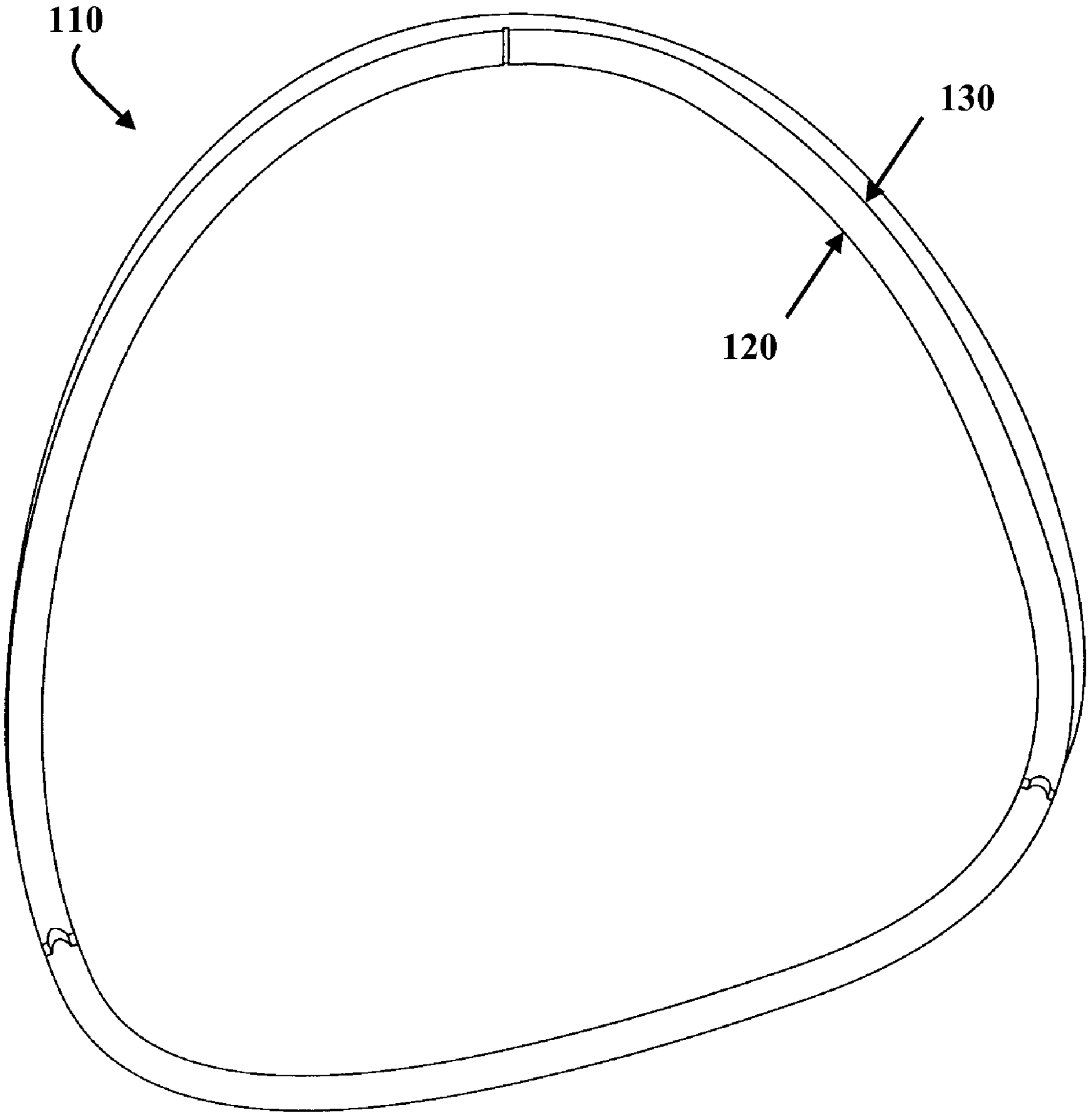
FIG. 2 is a sectional view taken along lines 2-2 of FIG. 1.
Figure 3:
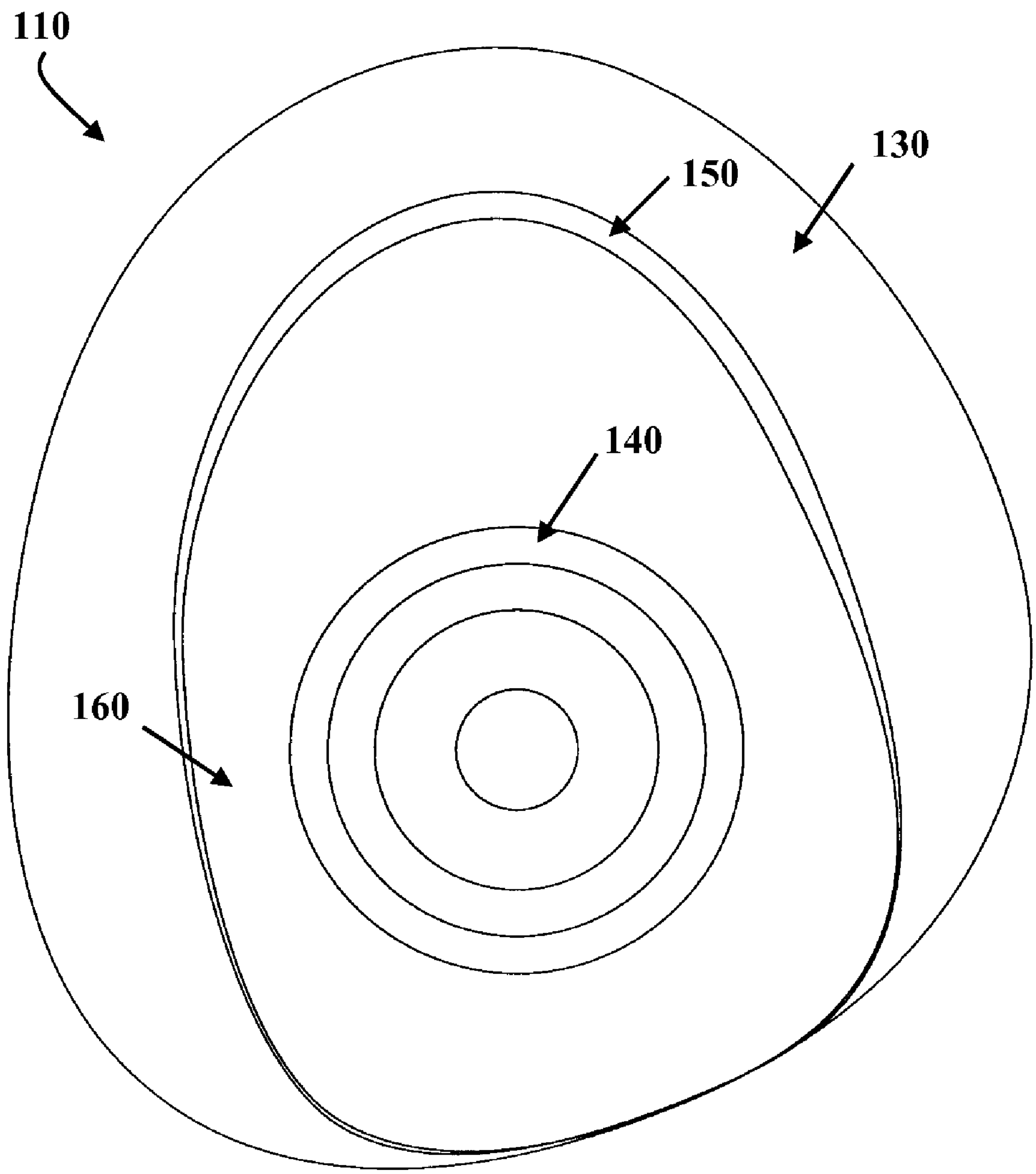
FIG. 3 shows a frontal view illustrating the invention in accordance with one embodiment.

FIGS. 1-3 show an embodiment of a loudspeaker enclosure 110 resulting from the process described above. The loudspeaker enclosure 110 further comprises an interior enclosure surface 120, a rear enclosure surface 130, a loudspeaker driver 140, a rounded edge surface 150, and an outer baffle surface 160.

The shape of the interior enclosure surface 120 is determined by an asymmetric and continuously curving function with a constantly changing radius, whereby substantially any cross section taken of it presents an asymmetric profile that curves in only one direction. Any cross section taken of the interior enclosure surface 120 is a looped, continuously curved, non-rational B spline. This is illustrated in FIG. 2, which is a sectional view taken along lines 2-2 of FIG. 1. Further, any cross section taken of the interior enclosure surface 120, when divided by any line will have asymmetric opposing sides.

The outer baffle surface 160 provides a surface for mounting a loudspeaker driver 140 to the speaker driver enclosure 110 and reflect acoustic waves toward a listener. The outer baffle surface 160 has a perimeter which is asymmetric and continuously curved such that the number of points along the perimeter that are equidistant from the loudspeaker driver 140 are substantially minimized. A rounded edge surface 150, having a cross section which is rounded and continuously curved is provided such that the multiplication of edge diffraction is substantially minimized.

In various embodiments the speaker driver enclosure 110 may further comprise at least one mounting plate 170, for mounting the speaker driver enclosure 110 to an object such as, e.g., a speaker stand or a wall mount bracket.

Figure 4:
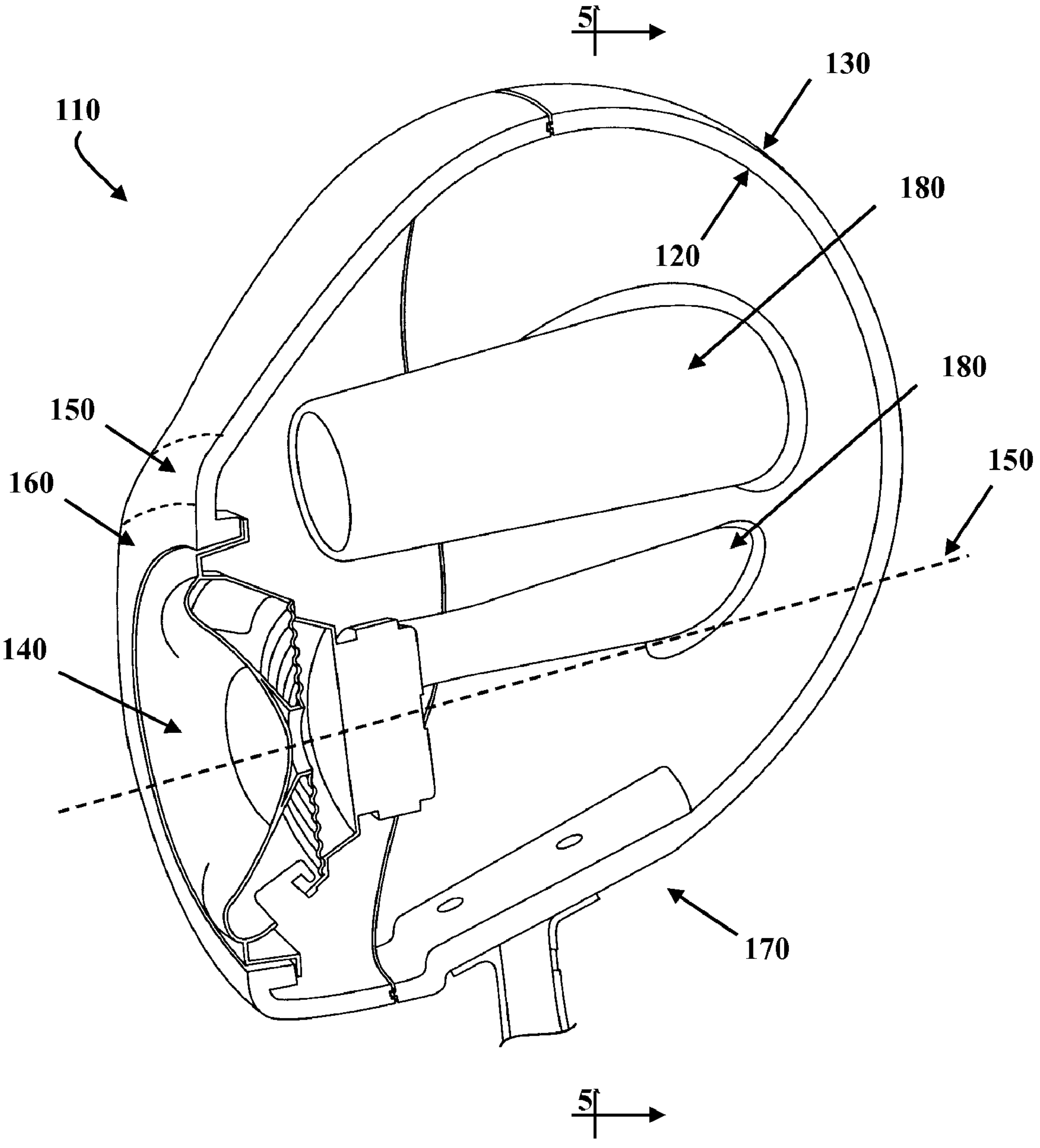
FIG. 4 shows a diagram illustrating the invention in accordance with one embodiment.
Figure 5:
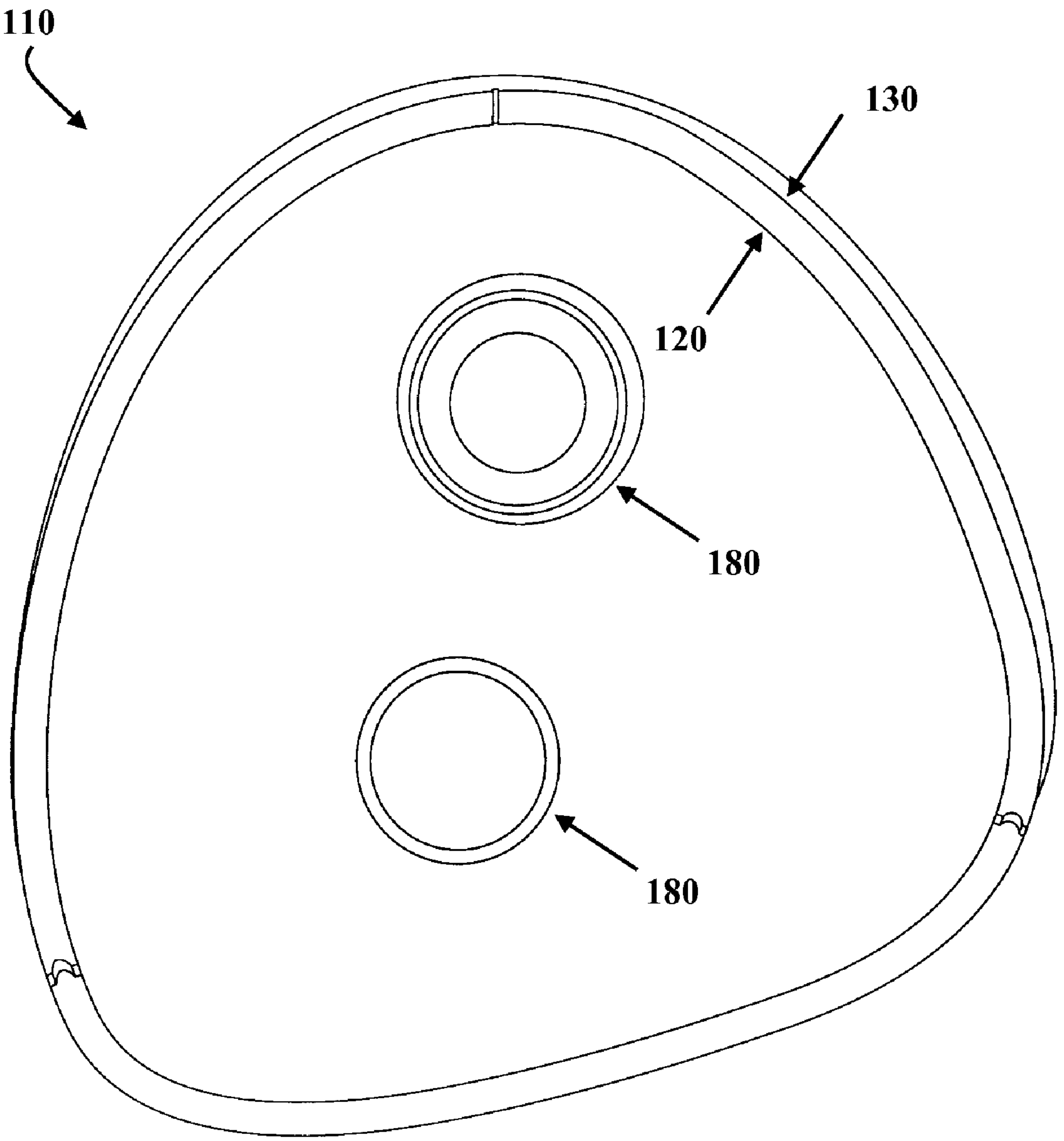
FIG. 5 is a sectional view taken along lines 5-5 of FIG. 4.

With reference to FIGS. 4 and 5, in various embodiments the speaker driver enclosure 110 may further comprise at least one port 180 to enhance the low frequency response of the speaker driver enclosure.

The embodiments of the invention in which an exclusive property or privilege is claimed are defined as follows:

1. A loudspeaker enclosure that substantially minimizes standing waves and diffracted wave multiplications comprising:

an interior enclosure surface, shaped such that any cross section taken of it comprises a looped, substantially continuously curved, non-rational B spline;

a rear enclosure surface, the rear enclosure surface being shaped substantially the same as the interior enclosure surface and offset from the interior enclosure by a wall thickness;

an outer baffle surface, the outer baffle surface comprising slightly varying curvatures such that substantially any cross section taken of it comprises a continuously curved, non-rational B spline and a flat surface shaped such that at least one loudspeaker driver may be mounted to it;

a loudspeaker driver; mounted to the flat surface; and, a rounded edge surface, whereby substantially every cross section taken along it has a slightly different continuously curved, non-rational B spline, whereby a line tangent to it does not intersect the flat surface.

2. The speaker driver enclosure of claim 1 further comprising at least one mounting feature.

3. The speaker driver enclosure of claim 1 further comprising at least one port.

4. A method for designing and manufacturing a loudspeaker enclosure that substantially minimizes standing waves and diffracted wave multiplications, comprising:

creating a closed volume with a continuously curved outer surface, with a substantially constantly changing radius, whereby substantially any cross section taken of the closed volume comprises a looped, continuously curved, non-rational B spline;

creating a first surface having a shape substantially similar to the closed volume;

creating a second surface, whereby the second surface comprises slightly varying curvatures such that substantially any cross section taken of it comprises a continuously curved, non-rational B spline and a flat surface shaped such that at least one loudspeaker may be mounted to it;

sizing the second surface, whereby it fully intersects the first surface and its surface area within the first surface contains the flat surface shaped such that at least one loudspeaker may be mounted to it;

merging the second surface with a larger portion of the first surface whereby a sharp edge is created where the first surface and the second surface intersect;

forming an outer baffle surface from the remaining portion of the second surface;

forming a rear enclosure surface comprising the remaining portion of the first surface;

forming an outer rounded edge surface, whereby substantially every cross section taken along it has a slightly different continuously curved, non-rational B spline, whereby a line tangent to it does not intersect the flat surface;

forming an inner surface, whereby the interior surface is a continuous surface offset from the outer baffle surface, outer rear enclosure surface, and outer rounded edge surface by a wall thickness; and, manufacturing at least one loudspeaker enclosure in accordance with the design.

5. The method of claim 4, further comprising affixing to the enclosure at least one mounting plate.

6. The method of claim 4, further comprising forming in the enclosure at least one port.

7. A loudspeaker enclosure that substantially minimizes standing waves, comprising:

an interior enclosure surface, shaped such that any cross section taken of it comprises a looped, substantially continuously curved, non-rational B spline;

a rear enclosure surface, the rear enclosure surface being shaped substantially the same as the interior enclosure surface and offset from the interior enclosure by a wall thickness;

an outer baffle surface comprising a flat surface shaped such that at least one loudspeaker driver may be mounted to it; and, a loudspeaker driver; mounted to the flat surface.

8. The speaker driver enclosure of claim 7 further comprising at least one mounting plate.

9. The speaker driver enclosure of claim 7 further comprising at least one port.

10. A loudspeaker enclosure that substantially minimizes standing waves and diffracted wave multiplications, comprising:

an interior enclosure surface;

a rear enclosure surface, the rear enclosure surface being shaped substantially the same as the interior enclosure surface and offset from the interior enclosure by a wall thickness;

an outer baffle surface, the outer baffle surface comprising slightly varying curvatures such that substantially any cross section taken of it comprises a continuously curved, non-rational B spline and a flat surface shaped such that at least one loudspeaker driver may be mounted to it;

a loudspeaker driver mounted to the flat surface; and, a rounded edge surface, shaped such that substantially every cross section taken along it has a slightly different continuously curved, non-rational B spline, whereby a line tangent to it does not intersect the flat surface.

* * * * *